(12) United States Patent
Sanderford et al.

(10) Patent No.: US 7,513,683 B2
(45) Date of Patent: Apr. 7, 2009

(54) METHOD, APPARATUS, AND SYSTEM FOR DETECTING HOT SOCKET DETERIORATION IN AN ELECTRICAL METER CONNECTION

(75) Inventors: H. Britton Sanderford, Covington, LA (US); Marc L. Reed, Mandeville, LA (US); Arlin Rummel, Pittsburgh, PA (US)

(73) Assignee: M & FC Holding, LLC, Raleigh, NC (US)

( * ) Notice: Subject to any disclaimer, the term of this patent is extended or adjusted under 35 U.S.C. 154(b) by 178 days.

(21) Appl. No.: 11/697,590

(22) Filed: Apr. 6, 2007

(65) Prior Publication Data

US 2008/0084216 A1 Apr. 10, 2008

Related U.S. Application Data

(60) Provisional application No. 60/850,343, filed on Oct. 10, 2006.

(51) Int. Cl.
*G01K 3/00* (2006.01)
(52) U.S. Cl. ........................................ 374/102; 374/107
(58) Field of Classification Search ................. 374/102, 374/107
See application file for complete search history.

(56) References Cited

U.S. PATENT DOCUMENTS

| 5,048,974 | A | * | 9/1991 | Dupuy ....................... 374/142 |
| 5,848,062 | A | * | 12/1998 | Ohno ......................... 370/311 |
| 6,697,757 | B2 | | 2/2004 | Eckel et al. |
| 2005/0007117 | A1 | | 1/2005 | Wright |
| 2006/0212194 | A1 | | 9/2006 | Breed |

* cited by examiner

*Primary Examiner*—Andre J Allen
(74) *Attorney, Agent, or Firm*—Oblon, Spivak, McClelland, Maier & Neustadt, P.C.

(57) ABSTRACT

A system for detecting, at a remote location, a deterioration in an electrical connection, such as an electrical meter socket connection, includes at least one deterioration sensing device that includes an apparatus for detecting, at a remote location, a deterioration in an electrical connection; at least one fixed or portable receiving communication device, each configured to receive temperature information from the at least one deterioration sensing device and to transmit the temperature information via a communication network; and a back end connected to the communication network and configured to receive temperature information from the at least one fixed or portable sensing communication device. Upon exceeding a predetermined condition, the back-end may forward an alarm warning to a utility.

20 Claims, 1 Drawing Sheet

US 7,513,683 B2

METHOD, APPARATUS, AND SYSTEM FOR DETECTING HOT SOCKET DETERIORATION IN AN ELECTRICAL METER CONNECTION

CROSS REFERENCE TO RELATED APPLICATIONS

The present application claims priority to U.S. provisional application No. 60/850,343, filed Oct. 10, 2006, and is related to U.S. patent application Ser. No. 10/662,530, entitled "ENHANCED WIRELESS PACKET DATA COMMUNICATION SYSTEM, METHOD, AND APPARATUS APPLICABLE TO BOTH WIDE AREA NETWORKS AND LOCAL AREA NETWORKS," filed Nov. 19, 2004, the entire contents of each of which are incorporated herein by reference.

BACKGROUND OF THE INVENTION

1. Field of the Invention

The present invention relates to a method, apparatus, and system for detecting a problem or deterioration in an electrical connection, and in particular, for remotely detecting a problem that results in an excessive temperature in an electricity meter.

2. Description of the Related Art

Conventional electrical connections may deteriorate for a variety of reasons, such as aging, harsh treatment, removal and insertion of a meter or operation in poor environments. Such deterioration may not be apparent until the electrical connection fails catastrophically. For example, deterioration in an electrical connection may not be apparent until the electrical connection becomes resistive causing a fire hazard, or goes open circuit.

SUMMARY OF THE INVENTION

Accordingly, one object of this invention is to provide a novel method of detecting, at a remote sensing location, a deterioration in an electrical connection, comprising steps of: sensing a change in a temperature of a mass in thermal contact with the electrical connection; detecting a predetermined condition; and transmitting information regarding the change in the temperature to the remote sensing location after detecting the predetermined condition.

Another object of this invention is to provide a novel apparatus for detecting, at a remote location, a deterioration in an electrical connection, said apparatus comprising: an enclosure having the electrical connection; a temperature sensor attached to a mass in thermal communication with the electrical connection and configured to produce temperature information about a temperature of the mass; and a controller configured to receive the temperature information from the temperature sensor and transmit the temperature information to the remote location.

A further object of this invention is to provide a novel system for detecting, at a remote location, a deterioration in an electrical connection, said system comprising: at least one deterioration sensing device that includes an apparatus for detecting, at a remote location, a deterioration in an electrical connection as described above; at least one portable sensing communication device each configured to receive temperature information from the at least one deterioration sensing device and to transmit the temperature information via a communication network; and a back end connected to the communication network and configured to receive temperature information from the at least one portable sensing communication device.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawing, wherein.

DETAILED DESCRIPTION OF THE PREFERRED EMBODIMENTS

Figure 1:
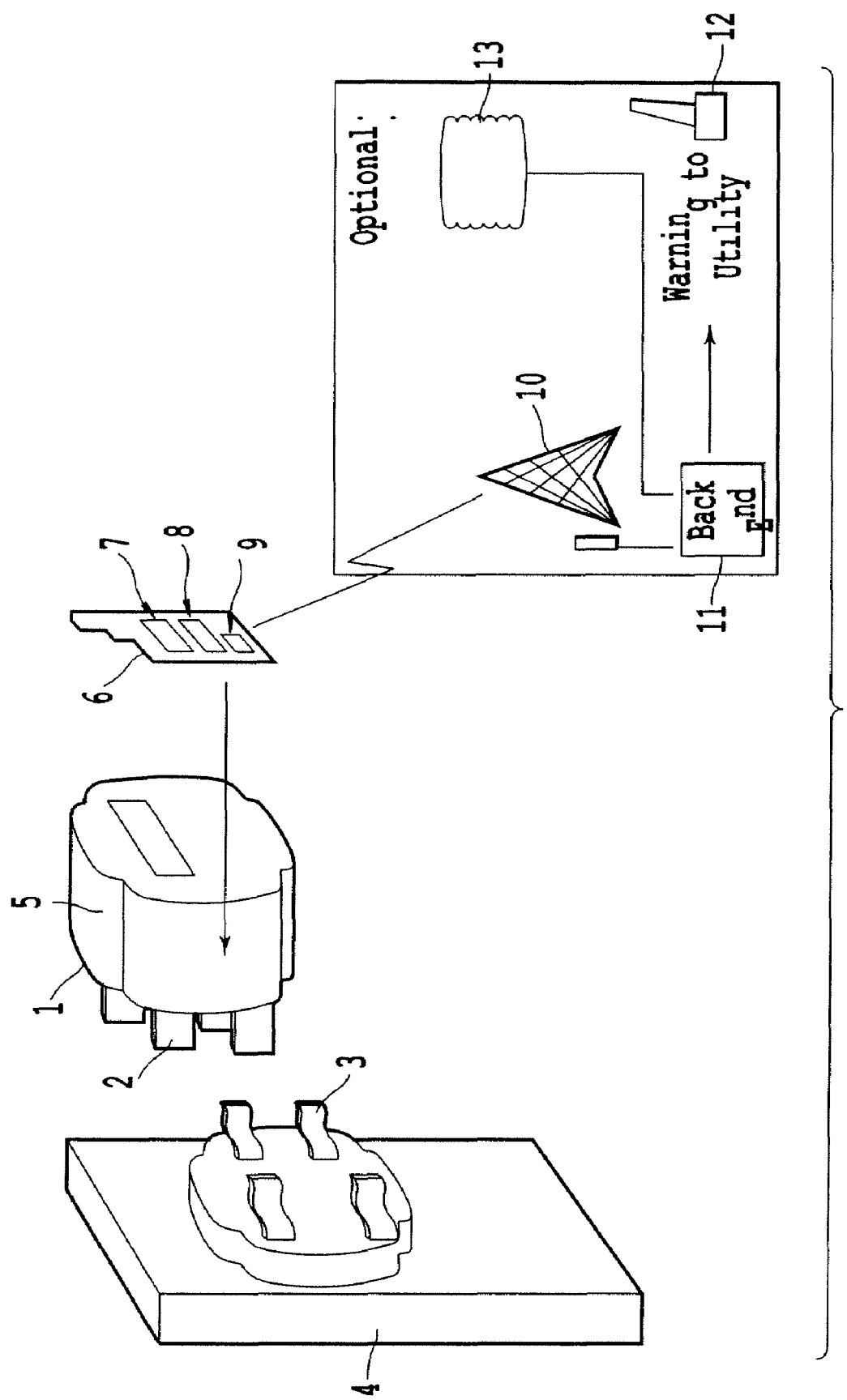
FIG. 1 is a block diagram of an apparatus according to an embodiment of the invention.

A deteriorated electrical connection may exhibit increased temperature prior to catastrophic failure of the electrical connection. For example, if an electrical connection is oxidized or corroded, or if a mechanical deterioration (e.g., reduced spring force in the meter socket jaws) results in poor connection between contacts in an electrical connection, a resistance of the electrical connection may increase. When the resistance of an electrical connection increases, power dissipation, and a corresponding thermal temperature, of the electrical connection may likewise increase.

Accordingly, by detecting an increase in a temperature of an electrical connection, a deterioration of the electrical connection may be detected, and a catastrophic failure of the electrical connection may advantageously be avoided or otherwise addressed.

Further, if information regarding the increased temperature may be provided remotely and automatically, a cost for detection of electrical connection failures may be reduced, and a reliability of electrical pathways that depend on the electrical connection may be advantageously increased.

In the following discussion of the drawings, like reference numerals designate identical or corresponding parts throughout the several views.

FIG. 1 is a block diagram of an electrical connection that includes an electricity meter 1 according to an embodiment of the present invention. The electricity meter 1 includes meter electrical contacts 2 that may be positioned to contact panel electrical contacts 3 on a meter power panel 4. The electricity meter 1 also includes an enclosure 5, which may include an insulating material such as glass or plastic. Further, the electricity meter 1 includes a communications board 6 located inside the enclosure 5. The communications board 6 may include a communication circuit 7 for communication of information between the electricity meter 1 and a sensing station 10. The sensing station can be, for example, a power line communications receiver located at a utility or sub-station, a drive-by vehicle outfitted with a radio receiver, a power pole mounted radio receiver capable of forwarding the meter information by any means to the utility, or a multiplicity of transceivers capable of forwarding information to a collation points (such as a mesh). Further, the communication board 6 may include a controller 8 configured to control an operation of the electricity meter 1 and a temperature sensor 9 configured to detect temperature information. The controller 8 may receive temperature information from the temperature sensor 9 and control the sending of the temperature information to the sensing station 10 via the communication circuit 7.

Further, the controller 8 may be configured to transmit temperature information to the sensing station 10 at a regular rate, for example, every 10 minutes or every 4 hours. Alternatively, the controller 8 may be configured to transmit the temperature information when predetermined temperature conditions occur (e.g., temperature exceeds a predetermined fixed temperature, or temperature increases at a rate greater than a predetermined "rate of rise" degrees/minute, or present temperature exceeds an average temperature by a predetermined percentage, etc. . . . ), or when a particular action occurs (e.g., turn-on/off in sensed power is detected, or communication signal requesting temperature (e.g., a polling message or wake up message) is received, etc. . . . ).

Further, in alternative embodiments, the temperature sensor 9 may not be included on the communication board and instead is mounted on a mass that is in thermal proximity with the electrical connection. For example, the temperature sensor 9 may be mounted elsewhere inside or outside the enclosure, or may be located separate from the enclosure, and the temperature sensor 9 may include a communication interface provided between the temperature sensor 9 and the controller 8. In the preferred embodiment, the temperature sensor is located in the microprocessor that is mounted on the communications board. Further, the communications board may include a printed circuit board (PCB).

The sensing station 10 may be coupled via a communications networks (e.g., a wireless radio network, an optical network, a Power Line Carrier, a wired network, etc. . . . ) to a back end 11 that is in communication with other similarly equipped electricity meters and is also in communication with an information user 12, such as a utility company. For example, the sensing station may be a hand-carried or vehicle-carried portable utility meter reading device (not shown) that comes within communication range of the electricity meter 1. Accordingly, the temperature information may be sent to the back end 11 and/or user 12, each of which may be located at remote locations. The back end 11 and/or user 12 may each advantageously employ the information, for example, to track failure rates, detect possible deterioration, or initiate maintenance.

Further, the user 12 or the back end 11 may send control information to the electricity meter 1 based on the received temperature information. For example, the control information may include new predetermined temperature thresholds, changes to an algorithm operating in the controller 8, or to provide other information used by the controller 8.

In an alternative embodiment, the controller 8 may communicate with the back end 11 or the user 12 via an intermediate device (not show) configured to operate as an intermediate relay point. For example, the intermediate device may operate as a relay device as described in U.S. patent application Ser. No. 10/662,530, entitled "ENHANCED WIRELESS PACKET DATA COMMUNICATION SYSTEM, METHOD, AND APPARATUS APPLICABLE TO BOTH WIDE AREA NETWORKS AND LOCAL AREA NETWORKS," the entire contents of which are incorporated herein by reference.

The back-end 11 may contain a processor and software that can collect the messages from the monitored meters. The processor can utilize the temperature information from the meter to determine when an alarm should be passed to a utility. The alarm determinations algorithms may include: temperature exceeds a predetermined fixed temperature, or temperature increases at a rate greater than a predetermined "rate of rise" degrees/minute, or present temperature exceeds an average temperature by a predetermined percentage, etc. . . . In addition the processor may be connected to a city wide source of temperature information, such as local weather station or internet web site 13. The processor can use this local temperature information to adjust up the alarm level on a hot day, or adjust down the alarm level on a cold day. In addition, the processor can adjust the alarm level based on a material used in the meter enclosure (e.g., whether the meter housing, enclosure, or cover is made of glass or plastic). These alternatives may compensate for the thermal resistance of the meter enclosure and for the differential temperature with outdoor ambient which both may affect the "normal range" temperature, which may be measured by the temperature sensor 9. Alternatively, the back-end can look at an average temperature of at least one meter and then notify a utility that corresponds to meters reporting a temperature that exceeds a normal temperature. Alternatively, the back-end can forward the raw temperature information and a processor at a utility could make a determination about the deterioration of the electrical contacts (i.e., the hot-socket determination).

Numerous modifications and variations of the present invention are possible in light of the above teachings. It is therefore to be understood that within the scope of the appended claims, the invention may be practiced otherwise than as specifically described herein.

The invention claimed is:

1. A method of detecting, at a remote location, a deterioration in an electrical connection, comprising steps of:
   sensing a change in a temperature of a mass in thermal contact with the electrical connection;
   detecting a predetermined condition; and
   transmitting information regarding the change in the temperature to the remote location after detecting the predetermined condition.

2. The method of claim 1, wherein the detecting the predetermined condition includes detecting if the sensed change in the temperature of the mass meets the predetermined condition.

3. The method of claim 1, wherein the detecting the predetermined condition includes detecting if the sensed change in the temperature of the mass indicates the temperature of the mass exceeds a predetermined temperature.

4. The method of claim 1, wherein the detecting the predetermined condition includes detecting if the sensed change in the temperature of the mass indicates a rate of temperature change of the mass exceeds a predetermined rate of temperature change.

5. The method of claim 1, further comprising:
   determining an average temperature based on the sensed change in the temperature of the mass,
   wherein the detecting the predetermined condition includes detecting if the sensed change in the temperature of the mass indicates the temperature of the mass exceeds the determined average temperature.

6. The method of claim 1, wherein the detecting the predetermined condition includes detecting a turn-on or turn-off of sensed power.

7. The method of claim 1, wherein the detecting the predetermined condition includes receiving a message regarding the sensed change in the temperature.

8. The method of claim 1, wherein the detecting the predetermined condition includes detecting an elapsed time.

9. The method of claim 1, further comprising the steps of:
   receiving control information regarding a different condition;
   detecting the different condition; and
   transmitting the information regarding the change in the temperature to the remote location after detecting the different condition.

10. The method of claim 1, further comprising a step of:
transmitting information regarding a material in the mass.

11. An apparatus for detecting, at a remote location, a deterioration in an electrical connection, said apparatus comprising:
an enclosure having the electrical connection;
a temperature sensor attached to a mass in thermal communication with the electrical connection and configured to produce temperature information about a temperature of the mass; and
a controller configured to receive the temperature information from the temperature sensor and transmit reporting information based on the temperature information to the remote location.

12. The apparatus of claim 11, wherein the controller is further configured to transmit the reporting information when the temperature information indicates the temperature of the mass meets a predetermined condition.

13. The apparatus of claim 11, wherein the controller is further configured to transmit the reporting information when the temperature information indicates the temperature of the mass exceeds a predetermined temperature.

14. The apparatus of claim 11, wherein the controller is further configured to transmit the reporting information when the temperature information indicates a rate of temperature change of the mass exceeds a predetermined rate of temperature change.

15. The apparatus of claim 11, wherein the controller is further configured to determine an average temperature based on the temperature information, and to transmit the reporting information when the temperature information indicates the temperature of the mass exceeds the average temperature.

16. The apparatus of claim 11, wherein the controller is further configured to detect a change in applied power and to transmit the reporting information when the change in applied power is detected.

17. The apparatus of claim 11, wherein the controller includes a receiving section configured to receive a message regarding the sensed temperature and the controller is further configured to transmit the reporting information when the message is received.

18. The apparatus of claim 11, wherein the controller includes a timer configured to detect an elapsed time and the controller is further configured to transmit the reporting information when the elapsed time is detected.

19. The apparatus of claim 11, further comprising:
a control receiving section configured to receive control information regarding a different condition, wherein the controller is further configured to detect the different condition based on the temperature information, and to transmit the reporting information when the different condition is detected.

20. A system for detecting, at a remote location, a deterioration in an electrical connection, said system comprising:
at least one deterioration sensing device that includes an apparatus for detecting, at a remote location, a deterioration in an electrical connection according to claim 11;
at least one portable sensing communication device each configured to receive temperature information from the at least one deterioration sensing device and to transmit the temperature information via a communication network; and
a back end connected to the communication network and configured to receive temperature information from the at least one portable sensing communication device.

* * * * *